US006434014B1

(12) United States Patent
Gerdom et al.

(10) Patent No.: US 6,434,014 B1
(45) Date of Patent: Aug. 13, 2002

(54) PRINTED CIRCUIT BOARD CONNECTION INCLUDING A CONDUCTOR FOIL

(75) Inventors: Karl Gerdom, Lubbecke; Gerd Weking, Lohne; Ulrich Wallenhorst, Wallenhorst; Rainer Schwan, Einhausen, all of (DE)

(73) Assignee: Harting KGaA (DE)

( * ) Notice: Subject to any disclaimer, the term of this patent is extended or adjusted under 35 U.S.C. 154(b) by 0 days.

(21) Appl. No.: 09/882,653

(22) Filed: Jun. 15, 2001

(30) Foreign Application Priority Data

Jun. 17, 2000 (DE) ........................................ 100 29 925

(51) Int. Cl.[7] ............................ H05K 1/14; H01R 9/09

(52) U.S. Cl. ...................... 361/752; 361/749; 361/784; 361/789; 361/803; 439/62; 174/254

(58) Field of Search ................................ 361/752, 753, 361/784–789, 803, 749, 748; 439/55, 62; 174/254

(56) References Cited

U.S. PATENT DOCUMENTS

| | | | | |
|---|---|---|---|---|
| 5,362,243 A | * 11/1994 | Huss et al. | ................. | 361/749 |
| 5,777,850 A | * 7/1998 | Jakob et al. | ................ | 361/736 |

FOREIGN PATENT DOCUMENTS

| | | |
|---|---|---|
| DE | 25 25 864 C 3 | 12/1976 |
| DE | 89 05 434.2 | 10/1990 |
| DE | 198 52 290 C 1 | 4/2000 |

* cited by examiner

*Primary Examiner*—Jayprakash N. Gandhi
(74) *Attorney, Agent, or Firm*—Cook, Alex, McFarron, Manzo, Cummings & Mehler, Ltd.

(57) ABSTRACT

A printed circuit board connection for connecting printed circuit boards provided with conductor tracks and arranged at a right angle with respect to each other consists of a first plug connector having an isolating housing and a plug-in portion provided with contact sleeves, and a second plug connector having an isolating housing and a plug-in portion provided with contact pins, each of the plug connectors being mounted at one of the printed circuit boards. A conductor foil is mounted at the isolating housing of the first plug connector, the conductor foil being provided with contact tracks. A first connection end of the conductor foil is held at the isolating housing of the first plug connector at a side opposite the printed circuit board at which the first plug connector is mounted, and a second connection end is held between a mounting surface of the first plug connector and the printed circuit board at which the first plug connector is mounted, the second connection end of the conductor foil being adjacent to contact pads of the conductor tracks at the printed circuit board.

9 Claims, 5 Drawing Sheets

PRINTED CIRCUIT BOARD CONNECTION INCLUDING A CONDUCTOR FOIL

The invention relates to printed circuit board connections for connecting printed circuit boards provided with conductor tracks and arranged at a right angle with respect to each other.

BACKGROUND OF THE INVENTION

A plug connection of this kind typically consists of a first plug connector having an isolating housing and a plug-in portion provided with contact sleeves, and a second plug connector having an isolating housing and a plug-in portion provided with contact pins, each of the plug connectors being mounted at one of the printed circuit boards.

The printed circuit board connection is preferably provided for use in a modularly formed signal processing system having a rearward printed circuit board and several insertable printed circuit boards which are to be connected with the rearward printed circuit board and which require additional electrical contacts to the rearward printed circuit board in order to cope with additional signals to be transmitted.

German Patent 198 52 290 shows an electrical plug connector for printed circuit boards, in particular for a rearward printed circuit board, wherein an adapter is inserted into a plug connector having five rows of contacts. The adapter allows to insert a female connector having three rows of contact springs.

German Patent Application 25 25 864 shows an arrangement for increasing the number of contacts of plug connectors of flat assemblies, wherein contact strips with projecting contacts are superimposed. A flexible foil provided with a filler element is inserted between the contacts. The flexible foil is provided with contact tracks which are soldered to conductor tracks on a printed circuit board.

German Utility Model 89 05 434 shows an arrangement for increasing the number of contacts of printed circuit board connectors, one of the printed circuit boards being arranged in front of a square isolating body having a plurality of contact elements. A first and a second conductor foil are provided which are associated to contact surfaces on top of and below the printed circuit board, the conductor foils being connected with first and second contact elements. Third contact elements are provided which serve for achieving a connection to the printed circuit board connector by means of rigid soldered contacts on the printed circuit board.

It is widely known to distribute electrical signals by means of printed circuit board connectors in various embodiments, the conductor tracks being suitably guided and being integrated into a bus structure on a rearward printed circuit board. Despite an increasing integration of electronical components, the number of signals to be distributed and to be processed increases. Further, increasing processing speeds are desired, which cannot be provided with a purely electrical system. Insofar, it is advantageous to use a combination of electrical and optical signals for distributing the signals. This however requires to incorporate electrooptical converters into the signal distribution system, these electro-optical converters requiring an additional electro-optical plug connection.

The invention is based on the object of improving an electrical printed circuit board connection of the type mentioned above by allowing to transmit additional electrical signals from one printed circuit board to the other printed circuit board in addition to the conventional signal connections, without the necessity of an additional plug connector.

BRIEF DESCRIPTION OF THE INVENTION

This object is solved with a printed circuit board connection for connecting printed circuit boards provided with conductor tracks and arranged at a right angle with respect to each other. The printed circuit board connection consists of a first plug connector having an isolating housing and a plug-in portion provided with contact sleeves, and a second plug connector having an isolating housing and a plug-in portion provided with contact pins, each of the plug connectors being mounted at one of the printed circuit boards. A conductor foil is mounted at the isolating housing of the first plug connector, the conductor foil being provided with contact tracks. A first connection end of the conductor foil is held at the isolating housing of the first plug connector at a side opposite the printed circuit board at which the first plug connector is mounted, and a second connection end is held between a mounting surface of the first plug connector and the printed circuit board at which the first plug connector is mounted, the second connection end of the conductor foil being adjacent to contact pads of the conductor tracks at the printed circuit board. The isolating housing of the second plug connector is provided with an isolating holder having a slot and electrical contacts arranged within the slot, the first connection end of the conductor foil being arranged within the slot and the contact tracks of the conductor foil being contacted by the electrical contacts arranged within the slot when the first and second plug connectors are inserted into each other.

Advantageous embodiments of the invention are defined in the subclaims.

The advantages achieved with the invention are in particular that an additional plug-in portion is provided in addition to the conventional plug-in portion of the printed circuit board connectors, this additional plug-in portion serving for transmission of additional electrical signals. This allows to achieve a higher data transfer rate. Further, existing plug connections can be upgraded with the printed circuit board connection according to the invention. An additional advantage is that the second, additional plug-in portion can be inserted simultaneously with the first plug-in portion.

An additional advantage results if the conductor foil is provided with contact tracks at both of its sides, which can be used for data transmission, whereby no additional contact tracks need to be provided at the insertable printed circuit board.

The electrical signals can be transmitted directly from the conductor tracks of the printed circuit board to the contact tracks of the conductor foil with a contact means which is optimised for conductor foils, a contact element being provided for pressing the contact tracks against the conductor tracks and for the electrical contact.

It is particularly advantageous if electro-optical elements are provided in the isolating housing of the second plug-in portion, this electro-optical elements being able to be connected by means of an electrical plug-in connection, the optical characteristics of the electro-optical elements, which allow significantly higher data transmission rates as compared to a purely electrical system, can be used in an optimum manner by means of optical data transmissions.

BRIEF DESCRIPTION OF THE DRAWINGS

The invention is explained with reference to a preferred embodiment which is shown in the accompanying drawings. In the drawings.

DETAILED DESCRIPTION OF THE INVENTION

Figure 1:
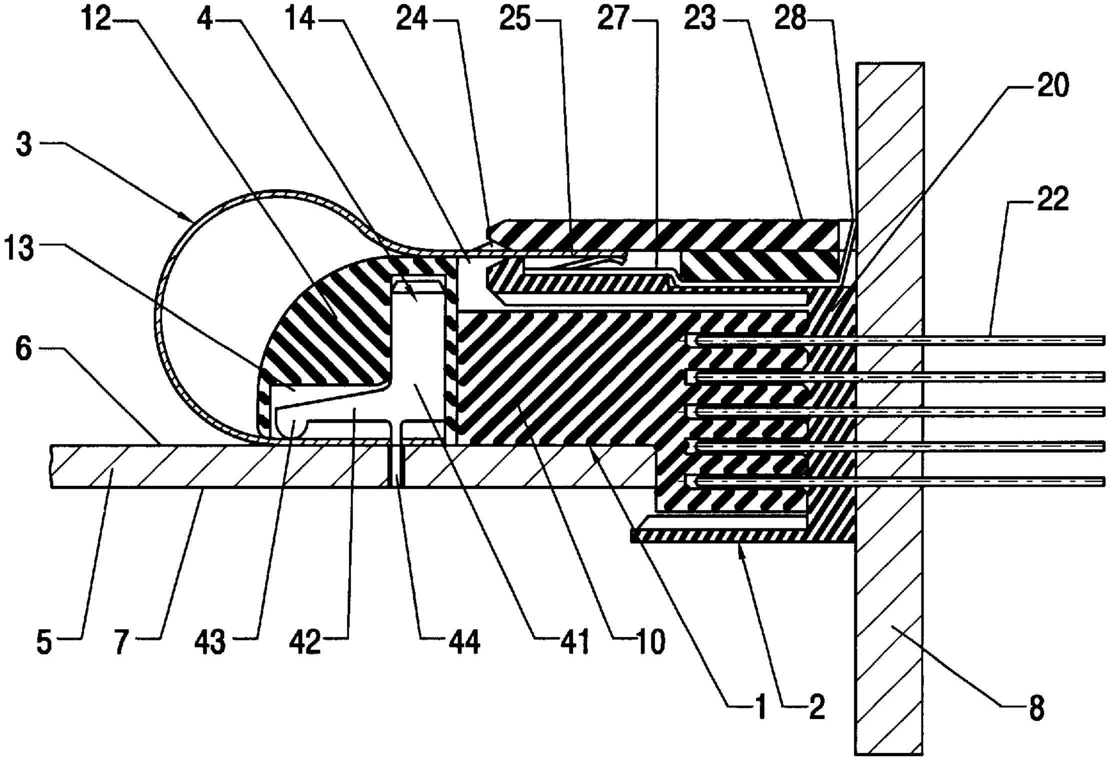
FIG. 1 shows a printed circuit board connection in a sectional view with the plug connectors inserted into each other.

FIG. 1 shows a printed circuit board connection in a sectional view with the plug connectors inserted into each other, the printed circuit board connection being formed from a first, angled plug connector 1 mounted on a printed circuit board 5 by means of a mounting surface, and a second, straight plug connector 2 mounted on a printed circuit board 8.

Plug connector 2 is formed with a U-shaped isolating housing 20 having asymmetrical side legs, the isolating housing having a plug-in portion 21 in which pin contacts 22 are arranged in columns and rows. The pin contacts are inserted at their opposite ends into bores in a printed circuit board 8.

On the longer one of the side legs of the isolating housing 20 of the plug connector 2, an isolating holder 23 is provided which can be formed integrally with the isolating housing 20 or can be formed as separate part and connected to the isolating housing.

The plug connector 1 is provided with spring contacts which are not shown in the drawings. The spring contacts co-operate with the pin contacts 22 of the plug connector 2 and form the electrical contacts of the printed circuit board connection.

The printed circuit board connector 1 is provided with a projection 12 at its rearward end towards the printed circuit board 5, the projection being provided with contact elements 4 which allow an electrical connection between conductor tracks 6 on the printed circuit board 5 and contact tracks 33 on a flexible conductor foil 3. The contact elements 4 are guided in recesses 13 in the projection 12, and the number of contact elements corresponds to the number of contact tracks on the flexible conductor foil 3. The projection 12 is formed as separate part which is attached to the plug connector and to the printed circuit board.

Figure 2:
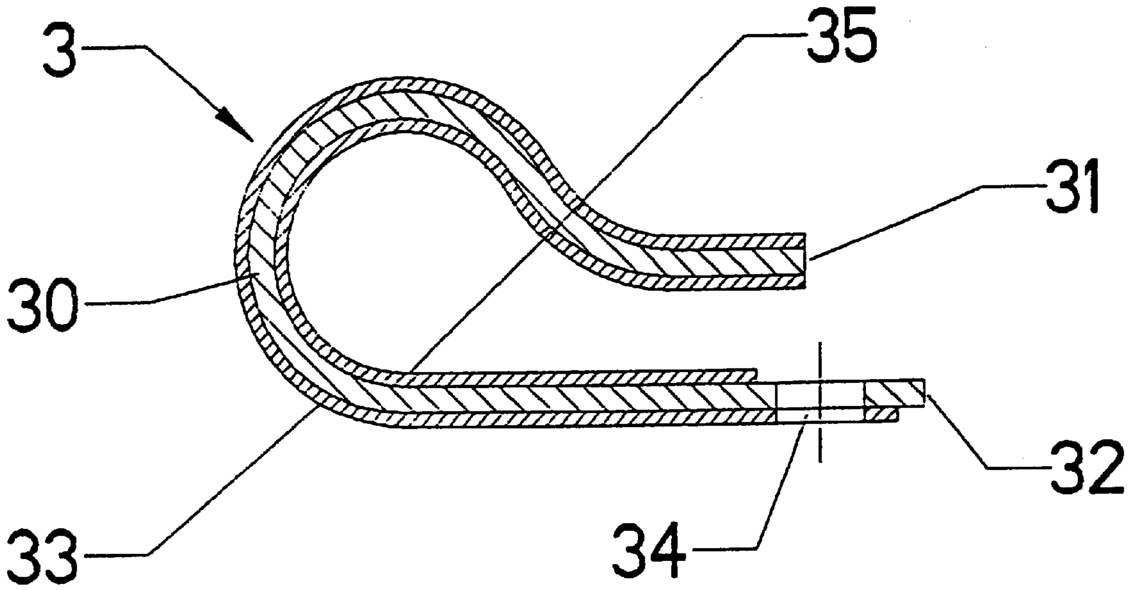
FIG. 2 shows a conductor foil in an enlarged sectional view.

The flexible conductor foil 3 which is shown enlarged in FIG. 2, consists of a flexible support foil 30 which is provided on both of its sides with contact tracks 33, 35 which are also flexible and serve for transmitting electrical signals. The conductor foil which is guided in a loop around projection 12, serves as a second signal transmission means towards the upper isolating holder 23 of the second plug connector 2.

FIG. 1 shows that the contact elements 4 are provided with a vertically extending leg 41 arranged within projection 12, and a horizontally extending spring leg 42. Further, a pin-shaped end 44 is provided which projects over the horizontally extending spring leg 42 and protrudes into a bore on the printed circuit board 5 in order to be electrically connected to a conductor track 7. The horizontally extending spring leg 42 is provided with a rounded end 43 at its side facing the printed circuit board. Vertically extending leg 41 which is held in recess 13, in co-operation with pin-shaped end 44 which protrudes into the bore in the printed circuit board, elastically biases the rounded end 43 of the horizontally extending spring leg 42 towards the surface of the printed circuit board 5.

The flexible conductor foil 3 is arranged between the contact elements 4 and the printed circuit board 5. The conductor foil has a connection end 32 provided with round openings 34 into which the pin-shaped ends 44 of the contact elements 4 engage, whereby the connection end 32 of the conductor foil is held at the plug connector 1 when the ends 44 engage into the respective bores in the printed circuit board 5. Contact elements 4 serve for pressing the conductor foil 3 with its contact tracks 33, 35 arranged on both sides onto the printed circuit board 5. The outer contact tracks 33 of the conductor foil are contacted by conductor tracks 6 arranged on the upper side of the printed circuit board 5 since they are pressed against the conductor tracks by the rounded ends 43 of the contact elements 4. The inner contact tracks 35 are directly contacted by the rounded ends 43 of the horizontally extending legs of the contact elements, the pin-shaped ends 44 of the contact elements 4 electrically connecting the contact tracks 35 with conductor tracks 7 on the lower side of the printed circuit board 5.

Figure 3:
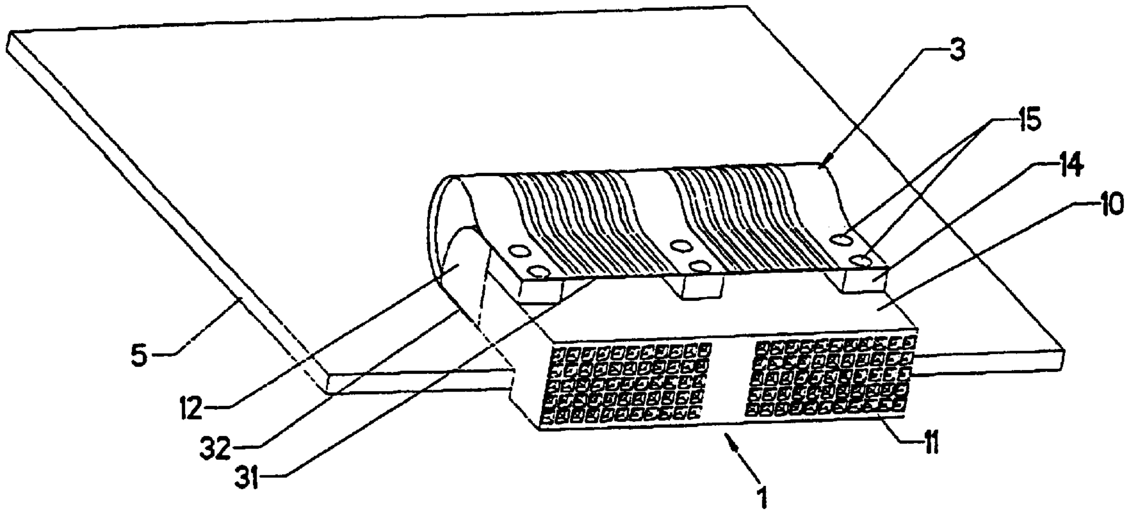
FIG. 3 shows a first plug connector in an isometrical view.

FIG. 3 shows the plug connector 1 in an isometrical view in a condition in which it is not inserted into the complementary plug connector. In this view, a second plug-in portion is clearly visible in addition to the conventional plug-in portion 11 of the plug connector, the second plug-in portion being formed by means of the conductor foil 3. On a side opposite the printed circuit board, three block-shaped holder elements 14 are provided to which the flexible conductor foil 3 is attached by means of a rivet-like attachment 15. The contact tracks 33, 35 on the conductor foil 3 are arranged in the free spaces between the holder elements, the connection end 33 of the conductor foil being inserted into slot 24 of the complementary plug connector 2 when the plug connectors are inserted into each other.

Figure 4:
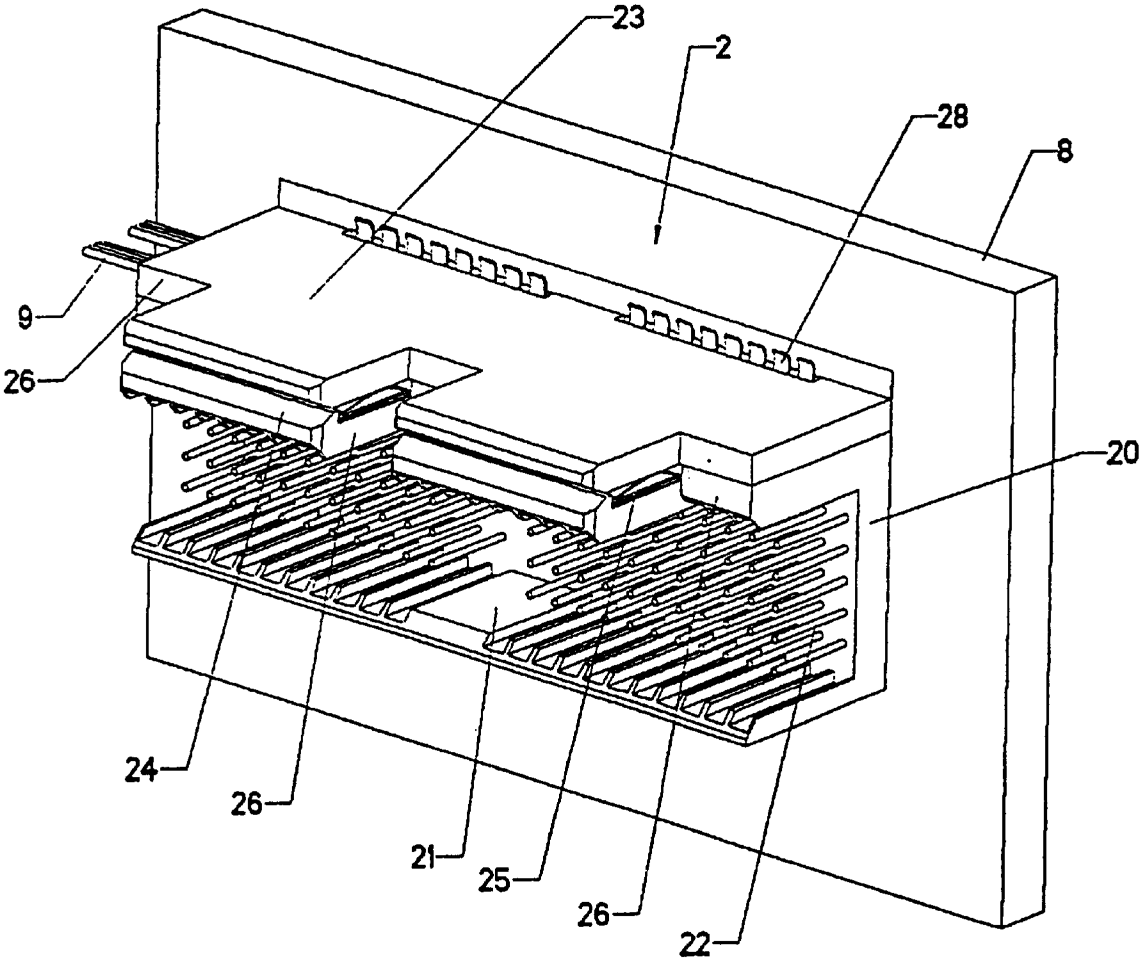
FIG. 4 shows a second plug connector in an isometrical view.

FIG. 4 shows the plug connector 2 in an isometrical view, the isolating housing 20 being formed with asymmetrical, U-shaped legs between which the plug-in portion 21 with contact pins 22 is provided. Adjacent the longer one of the legs of the isolating housing 20, the isolating holder 23 is arranged. The isolating holder 23 is provided with a slot 24 having recesses 26. Recesses 26 also extend into the corresponding leg of the isolating housing and are adapted to accommodate the holder elements 14 on the isolating housing 10 of plug connector 1. Recesses 26 allow to insert the connection end 31 of the conductor foil 3 into slot 24 of plug connector 2.

Upon insertion of the plug connectors into each other, connection end 31 of the conductor foil 3 is inserted into slot 24, whereby the resilient contacts 25 arranged below the conductor foil contact the contact tracks 35 and simultaneously press the upper contact tracks 33 against the electrical contacts 29. Slot 24 is provided with chamfered edges in order to allow insertion of the conductor foil.

The contact achieved with the contact tracks of the conductor foil is comparable to that described with respect to the printed circuit board 5. The contact elements 25 arranged below the flexible conductor foil 3 serve for transmitting the signals of the lower contact tracks 35, whereas the electrical contacts 29 arranged above the conductor foil serve for transmitting the signals of the upper contact tracks 33.

It is here provided to use the lower contact tracks 35 of conductor foil 3 as shield. To this end, the signals transmitted by means of the contact elements 25 are transmitted to a shielding element 27 made from sheet metal and arranged in the interior of the isolating holder 23, these signals being transmitted by means of spring contacts 28 formed integrally with the shielding element, to suitable conductor tracks on the printed circuit board 8.

Figure 5:
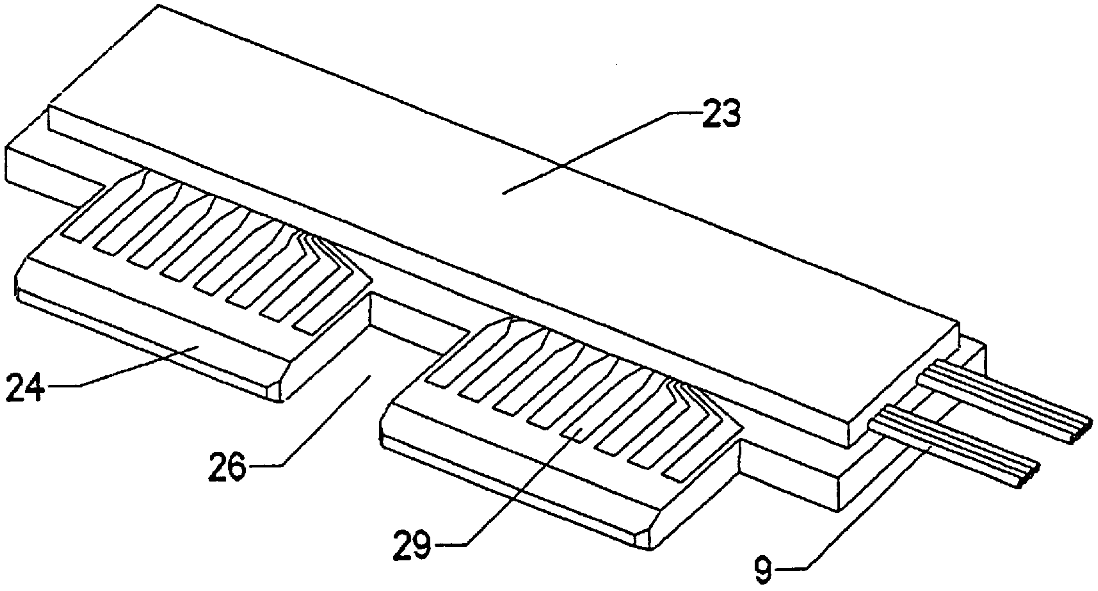
FIG. 5 shows an isolating holder in an isometric view.

FIG. 5 shows the isolating holder 3 of the plug connector 2 in an isometrical view after being detached from the isolating housing 20, the electrical contacts 29 being now visible. In the interior of the isolating holder 23, an electro-optical converter is arranged which is not visible in this Figure. The electrical contacts of the electro-optical converters are connected to the electrical contacts 29, and the optical connection of the electro-optical converter is connected to light guide fibres 9 protruding from the isolating holder. The isolating holder 23 can also be formed integrally with the isolating housing 20 rather than being formed as separate part which can be attached to the isolating housing.

What is claimed is:

1. A printed circuit board connection for connecting printed circuit boards provided with conductor tracks and arranged at a right angle with respect to each other, said printed circuit board connection consisting of a first plug connector having an isolating housing and a plug-in portion provided with contact sleeves, and a second plug connector having an isolating housing and a plug-in portion provided with contact pins, each of said plug connectors being mounted at one of a printed circuit board, a conductor foil being mounted at said isolating housing of said first plug connector, said conductor foil being provided with contact tracks, with a first connection end held at said isolating housing of said first plug connector at a side opposite said printed circuit board at which said first plug connector is mounted, and with a second connection end held between a mounting surface of said first plug connector and said printed circuit board at which said first plug connector is mounted, said second connection end of said conductor foil being adjacent to contact pads of said conductor tracks at said printed circuit board, said isolating housing of the second plug connector being provided with an isolating holder having a slot and electrical contacts arranged within said slot, said first connection end of said conductor foil being arranged within said slot and said contact tracks of said conductor foil being contacted by said electrical contacts arranged within said slot when said first and second plug connectors are inserted into each other.

2. The printed circuit board connection of claim 1, wherein said conductor foil is guided around said isolating housing of said first plug connector exteriorly of said isolating housing.

3. The printed circuit board connector of claim 2, wherein said isolating housing of said first plug connector is provided with a rounded projection, said conductor foil being guided around said projection.

4. The printed circuit board connection of claim 1, wherein contact elements are arranged in recesses of said projection of said isolating housing, said contact elements having a spring leg with a rounded end which, when said first plug connector is mounted, presses said contact tracks of said conductor foil on said contact pads of said conductor tracks of said printed circuit board whereby said contact tracks electrically contact said conductor tracks.

5. The printed circuit board connection of claim 1, wherein said conductor foil has two sides, said contact tracks being provided on both of said sides.

6. The printed circuit board connection of claim 1, wherein holder elements are provided at said isolating housing of said first plug connector, at which said first connection end of said conductor foil is attached.

7. The printed circuit board connection of claim 1, wherein said conductor foil is held at said mounting surface of said first plug-connector by means of pin-shaped ends formed at said contact elements, said pin-shaped ends protruding through openings at said second connection end in said conductor foil.

8. The printed circuit board connection of claim 1, wherein a shielding element made from sheet metal is arranged within said isolating holder for shielding said electrical contacts in said isolating housing of said second plug connector with regard to said contact pins in said isolating holder, said shielding element having integrally formed contacts facing a mounting side of said printed circuit board.

9. The printed circuit board connection of claim 1, wherein at least one electro-optical converter is provided within said isolating housing of said second plug connector, said converter having electrical leads connected to said contact elements within said slot, an optical connection of said connector being connected to light guide fibres.

* * * * *